United States Patent
Chen

(10) Patent No.: US 8,039,821 B2
(45) Date of Patent: Oct. 18, 2011

(54) ION IMPLANTATION SYSTEMS

(75) Inventor: Jiong Chen, San Jose, CA (US)

(73) Assignee: Kingstone Semiconductor Company, Limited (CN)

(*) Notice: Subject to any disclaimer, the term of this patent is extended or adjusted under 35 U.S.C. 154(b) by 37 days.

(21) Appl. No.: 12/661,523

(22) Filed: Mar. 18, 2010

(65) Prior Publication Data
US 2010/0237260 A1  Sep. 23, 2010

Related U.S. Application Data

(60) Provisional application No. 61/210,479, filed on Mar. 18, 2009.

(51) Int. Cl.
*H01J 37/317* (2006.01)

(52) U.S. Cl. .................................. 250/492.21
(58) Field of Classification Search ............. 250/492.21
See application file for complete search history.

(56) References Cited

U.S. PATENT DOCUMENTS 6,414,327 B1 * 7/2002 Klinkowstein et al. .. 250/492.21

* cited by examiner

*Primary Examiner* — Kiet Nguyen
(74) *Attorney, Agent, or Firm* — Bo-In Lin

(57) ABSTRACT

An ion implantation apparatus of high energy is disclosed in this invention. The new and improved system can have a wide range of ion beam energy at high beam transmission rates and flexible operation modes for different ion species. This high energy implantation system can be converted into a medium current by removing RF linear ion acceleration unit.

1 Claim, 3 Drawing Sheets

ION IMPLANTATION SYSTEMS

The Non-Provisional Application claims a Priority Date of Mar. 18, 2009 benefited from a Provisional Application 61/210,479 filed by a same Applicant of this Non-Provisional Application. The disclosures made in Provisional Application 61/210,479 are hereby incorporated by reference in this Non-Provisional Application.

FIELD OF THE INVENTION

The invention disclosed herein relates generally to ion implantation. Specifically, this invention is related to a high energy ion implantation system with a wide range of ion beam energy at high beam transmission rates and flexible operation modes for different ion species and can be converted into a medium current by removing RF linear ion acceleration unit.

BACKGROUND OF THE INVENTION

Ion beam implanters are widely used in the process of doping of semiconductor wafers with a desired species of ions. An ion beam implanter generates an ion beam comprises of the desired species of ions. The ion beam impinges upon an exposed surface of a semiconductor wafer workpiece thereby "doping" or implanting the workpiece surface with desired ions. Some ion beam implanters utilize serial implantation wherein a single semiconductor wafer workpiece is positioned on a support in an implantation chamber. The support is oriented such that the workpiece is in the ion beam beamline and the ion beam is repetitively scanned over the workpiece to implant a desired dosage of ions. When implantation is complete, the workpiece is removed from the support and another workpiece is positioned on the support.

In U.S. Pat. No. 6,137,112, a high-energy ion beam implanter is disclosed as that shown in FIG. 1. The implanter 10 produces an ion beam 14 having beam energy in the range of 10-5000 kilo-electron volts (keV). The implanter 10 includes an ion source 12 for providing ions that form the ion beam 14 which traverses a beam path to an implantation or end station 16. The implanter 10 utilizes a radio frequency (RF) ion accelerator 18 to accelerate ions in the ion beam 14 to suitably high velocities to achieve the desired ion beam energy. A suitable RF ion accelerator 18 for use in a high energy implanter is disclosed in U.S. Pat. No. 4,667,111 to Glavish et al.

The high energy ion beam implanter uses a rotating, translating disk-shaped support on which workpieces are mounted. A plurality of semiconductor workpieces are mounted on the disk-shaped support. The support is supported in an implantation chamber of an end or implantation station of the ion beam implanter. The rotation and translation of the support allows each of the plurality of workpieces to be exposed to the ion beam during a production run with reliable and accurate dose control and large ion beam thermal power dissipation because the power can be evenly irradiated on several wafers.

However, as the wafer size increases from 200 to 300 mm in semiconductor chip manufacturing, users have been adopting a concept or processing a wafer at time, which is called serial implantation wherein a single semiconductor wafer workpiece is positioned on a support in an implantation chamber. The support is oriented such that the workpiece is in the ion beam line and the ion beam is repetitively scanned over the workpiece to implant a desired dosage of ions. When implantation is complete, the workpiece is removed from the support and another workpiece is positioned on the support. This serial implantation concept is widely used in medium dose implantation apparatus. A medium current ion implanter as shown in FIG. 2B of U.S. Pat. No. 6,777,696 has the following sub-systems.

FIG. 2 illustrates an ion implantation system 262 suitable for medium current ion implants. The system 262 includes an ion source 282, wherein the gas(es) can be ionized to generate ions suitable for implantation into wafers or workpieces. An ion beam extraction assembly 276 is included to extract ions from the ion source 282 and accelerate them into a beamline 278, which includes a mass analysis magnet 280. The mass analysis magnet 280 is operable to sort out or reject ions of an inappropriate charge-to-mass ratio. In order to obtain uniform implants over workpieces ion beam scanning component 270 and a component 284 must be included in a serial implanter system. The beam collimator 284 is to control the angle of the scanned ion beam. An acceleration/deceleration column 286 facilitates controlling and adjusting the ion beam energy. A component 288 may be included to filter out contaminant particles, such as a final energy. Wafers or workpieces 290 are loaded into an end station chamber 292 for selective implantation with ions. A mechanical scan drive 294 maneuvers the wafers within the chamber 292 to facilitate selective encounters with the beam(s). The wafers or workpieces 290 are moved into the end station chamber 292 by a wafer handling system 296, which may include, for example, one or more mechanical or robotic arms 297.

Conventionally, medium and high energy ion implanters are two very different types of implanters as shown FIG. 1 and FIG. 2. The implanter manufacturers release two total different designs. It would add costs on manufacturing and complexity for the users to operate the systems. To combine the two machines into one system is possible in a serial implantation system.

On the other hand, high energy ion implanters use RF electrical fields to accelerate ions to 10 to 5000 kilo-electron volts (keV). However, there is a set of optimal ion velocity values in a particularly designed RF linear accelerator (LINAC). In ion implantation applications, wide ranges of ion energy (10-4,000 keV) and different species ions (boron, silicon, phosphorus, and arsenic are commonly used) so that the sets of ion velocities in LINAC can be over one hundred. The RF LINAC high energy ion implanters were designed with many resonator cavities to compensate these velocity unmatched values. But the cavity number can be too large because of its costs and space limitations. Therefore, imperfect velocity matches inside LINAC are resulted, consequently, poor ion transmissions through LINAC and degradations of LINAC components (due to un-transmitted ion bombardments are observed.

DESCRIPTION OF THE PREFERRED EMBODIMENTS

Figure 4:
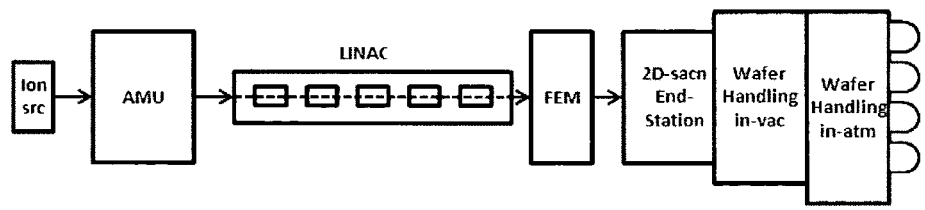
FIG. 4 is a functional block diagram for illustrating the system configuration of a high energy ion beam implant system.

This invention is related to a high energy ion implantation system shown in FIG. 4. The inventor high energy implanter can have a wide range of ion beam energy at high beam transmission rates and flexible operation modes for different ion species. This high energy implantation system can be converted into a medium current by removing RF linear ion acceleration unit.

The ion implantation system includes an ion source labeled as "Ion src" and an atomic mass unit (AMU) implemented as a mass analyzer.

Beam scan: beam scanner that scan ion beams electrically or magnetically. The beam scan angle must be large enough so that the beam scanning displacement must be greater than the wafer diameter when the beam propagates the beam collimator.

DC acceleration or deceleration: use direct current electrostatic ion beam acceleration or deceleration.

The FEM: final energy filter magnet (sometime people use electrostatic device) to make ion beam energy more accurate.

The End-station: a wafer is hold on platen that is mechanically scanned in a direction is perpendicular to the ion beam so that the wafer is translated in/out of the scan ion beam.

Wafer handling in-vac: wafer transporter that is located in high vacuum environment.

Wafer handling in-air: wafer transporter that is located in atmospheric environment.

FIG. 4 is a functional block diagram that shows a high energy ion implanter.

The LINAC: linear accelerator uses the RF electric field to accelerate ions to higher energy. A two-dimensional-scan End-station is implemented that has no: beam scanner. Therefore, the wafer must be scanned in two-dimensions to ensure the implant dose uniformity.

Figure 1:
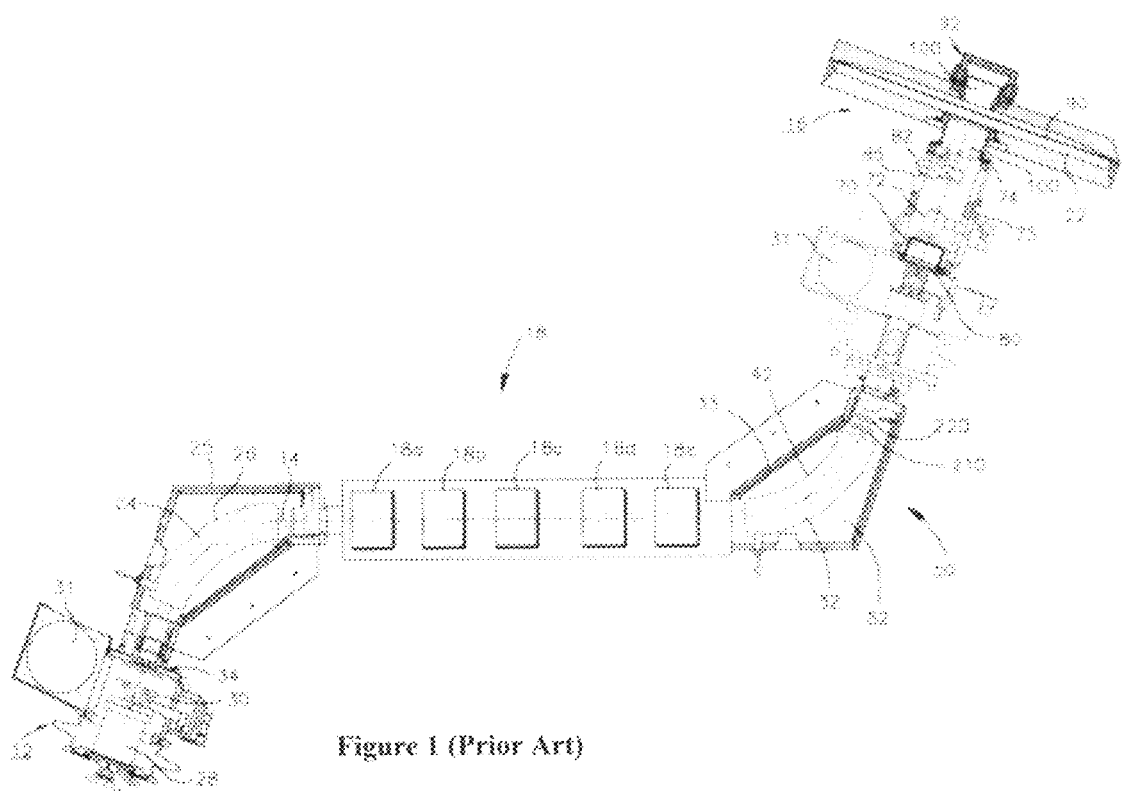
FIG. 1 is a perspective view of a high energy ion beam implanter disclosed in a previously patented invention.
Figure 2:
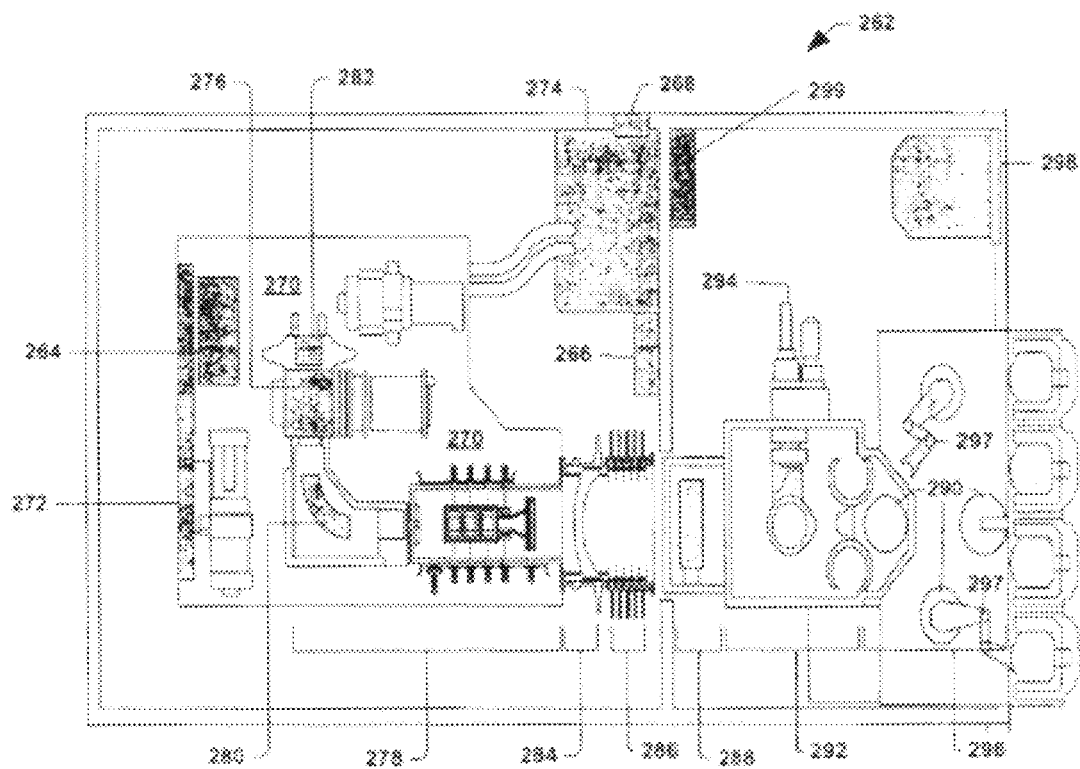
FIG. 2 illustrates a conventional ion implantation system suitable for medium current ion implantation.
Figure 3:
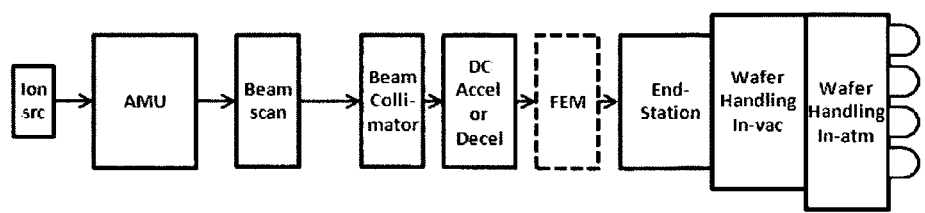
FIG. 3 is a functional block diagram for illustrating the system configuration of a medium current ion beam implant system.
Figure 5:
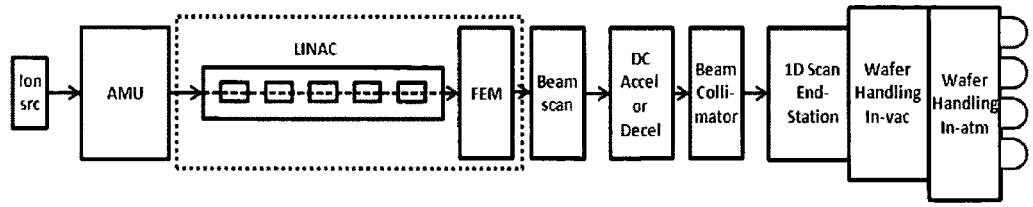
FIG. 5 is a functional block diagram for illustrating the system configuration of the present invention to carry out ion implantation with medium current and high energy ion beam.

FIG. 5 shows a system of the present invention. The functional blocks as shown in FIGS. 3, 4 and 5 can be further described with the following explanations:

AMU: atomic mass unit, here it stands for mass analyzer.

Beam scan: beam scanner that scan ion beams electrically or magnetically. The beam scan angle must be large enough so that the beam scanning displacement must be greater than the wafer diameter when the beam propagates the beam collimator.

Beam collimator: to make the scanned beam collimated.

DC acceleration or deceleration: use direct current electrostatic ion beam acceleration or deceleration.

FEM: final energy filter magnet (sometime people use electrostatic device) to make ion beam energy more accurate.

Endstation: a wafer is hold on platen that is mechanically scanned in a direction is perpendicular to the ion beam so that the wafer is translated in/out of the scan ion beam.

Wafer handling in-vac: wafer transporter that is located in high vacuum environment.

Wafer handling in-air: wafer transporter that is located in atmospheric environment.

The new and improved system shown in FIG. 5 has the following advantages because the LINAC and FEM are arranged to dispose between AMU and Beam scan modules.

1) The energy or species of ion beams can be varied smoothly because we can choose a series of fixed LINAC injecting velocities. The ion final velocities at which ions impinge on the wafers can be adjusted by DC acceleration or deceleration.

2) The system has a simplified configuration and become more reliable and can be provided at significantly reduced costs.

Although the present invention has been described in terms of several embodiments, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A method of configuring and applying an ion implantation apparatus comprising:
converting a high energy implantation system into a medium current implantation system by removing a RF ion acceleration unit to have a wide range of ion beam energy at high beam transmission rates and flexible operation modes for different ion species.

* * * * *